(12) United States Patent
Liao et al.

(10) Patent No.: US 10,763,302 B2
(45) Date of Patent: Sep. 1, 2020

(54) DISPLAY PANEL AND REPAIRING METHOD THEREFOR

(71) Applicant: PLAYNITRIDE INC., Tainan (TW)

(72) Inventors: Kuan-Yung Liao, Tainan (TW); Yun-Li Li, Tainan (TW); Yu-Chu Li, Tainan (TW); Chih-Ling Wu, Tainan (TW); Ching-Liang Lin, Tainan (TW); Pai-Yang Tsai, Tainan (TW)

(73) Assignee: PLAYNITRIDE INC., Tainan (TW)

( * ) Notice: Subject to any disclaimer, the term of this patent is extended or adjusted under 35 U.S.C. 154(b) by 0 days.

(21) Appl. No.: 16/192,623

(22) Filed: Nov. 15, 2018

(65) Prior Publication Data
US 2019/0157340 A1    May 23, 2019

(30) Foreign Application Priority Data
Nov. 17, 2017    (TW) .............................. 106139994 A

(51) Int. Cl.
*H01L 29/18* (2006.01)
*H01L 33/00* (2010.01)
*H01L 27/15* (2006.01)
*G09G 3/32* (2016.01)
*H01L 25/075* (2006.01)

(52) U.S. Cl.
CPC ............. *H01L 27/156* (2013.01); *G09G 3/32* (2013.01); *H01L 25/0753* (2013.01); *G09G 2300/0426* (2013.01); *G09G 2330/08* (2013.01)

(58) Field of Classification Search
CPC ..... H01L 27/156; H01L 25/0753; G09G 3/32; G09G 2300/0426; G09G 2330/08; G09G 3/006
See application file for complete search history.

(56) References Cited

U.S. PATENT DOCUMENTS

| | | | |
|---|---|---|---|
| 2014/0217429 A1 | 8/2014 | Lin et al. | |
| 2015/0221671 A1* | 8/2015 | Voutsas | H01L 27/1288 257/72 |
| 2019/0013297 A1* | 1/2019 | Lai | H01L 25/0753 |
| 2019/0066592 A1* | 2/2019 | Kim | G09G 3/32 |
| 2019/0174595 A1* | 6/2019 | Hsiang | H01L 27/156 |
| 2019/0198715 A1* | 6/2019 | Lim | G02F 1/133603 |
| 2019/0326267 A1* | 10/2019 | Han | H01L 25/0753 |
| 2020/0013766 A1* | 1/2020 | Kim | H01L 25/167 |

FOREIGN PATENT DOCUMENTS

TW        201432360 A    8/2014

* cited by examiner

*Primary Examiner* — Ismail A Muse
(74) *Attorney, Agent, or Firm* — Maschoff Brennan

(57) ABSTRACT

A display panel and a repairing method thereof. The display panel includes micro LEDs and a circuit substrate. The circuit substrate includes first wires, second wires and connecting circuits. Respective one of the connecting circuits is configured to be electrically connected to respective one of the micro LEDs. Each of the connecting circuits includes a first pad, a second pad, a third pad and a connecting wire. The first pad is configured to be electrically connected to the corresponding micro LED and one of the first wires. The first and second pads are separated by a first gap. The second pad is configured to be electrically connected to one of the second wires. The second and third pads are separated by a second gap. The connecting wire is connected to the second pad and the third pad.

9 Claims, 15 Drawing Sheets

DISPLAY PANEL AND REPAIRING METHOD THEREFOR

CROSS-REFERENCE TO RELATED APPLICATIONS

This non-provisional application claims priority under 35 U.S.C. § 119(a) on Patent Application No(s). 106139994 filed in Taiwan, R.O.C. on Nov. 17, 2017, the entire contents of which are hereby incorporated by reference.

BACKGROUND

Technical Field

The disclosure relates to a display panel and a repairing method thereof, more particularly to a display panel, in which connecting circuits for micro light emitting diodes (μ-LEDs) are disposed, and a repairing method thereof.

Related Art

LEDs have benefits of high energy conversion efficiency, small size and long lifespan and thus, they nowadays have greatly been applied to various electronic products. LEDs usually function as indictors, illuminators or are applied to a displayer for image display.

Diode components generally have cathode and anode electrodes. When a LED is disposed in a pixel unit in a display panel, the two electrodes of the diode component are respectively disposed on the corresponding pads. Because one or more blemishes may occur in the manufacturing process, misalignment in the disposition of a diode component may cause that the two electrodes of the diode component cannot have proper electrical connection with pads, leading to an open-circuit defect. Alternatively, improper bonding causes fusion or deformation in the structure of the diode component, so the diode component becomes a good conductor, leading a short circuit. Alternatively, a single electrode of a diode component contacts two pads of two different electrical polarities, leading to a short-circuit defect.

In the development of the present industry, LED miniaturization is a white hope for the next generation of semiconductor technology. In the related art, the LED size has been reduced to the micron scale. In the manufacturing of some kinds of display panels, micro LEDs are formed on the same epitaxial wafer by the chip process and then are moved to a substrate with driving circuits by the mass transfer process. During the mass transfer, the above open-circuit defect or short-circuit defect may occur.

SUMMARY

The disclosure intends to provide a display panel and a repairing method thereof so that the display panel can have better performance.

According to one or more embodiments of the disclosure, a display panel includes micro LEDs and a circuit substrate. The circuit substrate includes first wires, second wires, and connecting circuits. The micro LEDs are separately disposed on the circuit substrate. Respective one of the connecting circuits is electrically connected to respective one of the micro LEDs. Each of the connecting circuits includes a first pad, a second pad, a third pad, and a first connecting wire. The first pad is configured to be electrically connected to one of the first wires, and is also configured to be electrically connected to the first electrode of the corresponding micro LED. The first and second pads have a first gap therebetween. The second pad is configured to be electrically connected to the second electrode of the corresponding micro LED. The third pad is electrically connected to one of the second wires. The second and third pads have a second gap therebetween. The second pad is located between the first and third pads. The first connecting wire i s connected to the second and third pads.

In an embodiment, the circuit substrate further includes sub pixel regions. One of the connecting circuits is located in one of the sub pixel regions and further includes a fourth pad and a fifth pad. The fourth pad is electrically connected to the first wire connected to the first pad. The first and fourth pads are respectively located at two sides of the first wire connected to the first pad. The fifth pad is electrically connected to the second wire connected to the third pad. The fourth and fifth pads have a fifth gap therebetween. The fourth pad is located between the first and fifth pads.

According to one or more embodiment, the disclosure provides a repairing method for a display panel. The display panel includes a circuit substrate and micro LEDs. The circuit substrate includes connecting circuits. Respective one of the connecting circuits is electrically connected to respective one of the micro LEDs. Each of the connecting circuits includes a first pad, a second pad, a third pad and a connecting wire. The first to third pads are separated from each other, and the connecting wire is connected to the second and third pads. The first pad is electrically connected to one of first wires. The third pad is electrically connected to one of second wires. The two electrodes of the corresponding micro LED are respectively bonded to the first and second pads. In the repairing method, a test signal is supplied to at least one of the connecting circuits to drive the corresponding micro LED for operation. Then, check whether one of the micro LEDs is at a normal status, an open-circuit status or a short-circuit status. When the micro LED in one of the connecting circuits is at the open-circuit status, a standby micro LED is bonded to the first and second pads so that the standby micro LED is electrically connected to the connecting circuit. When the micro LED in one of the connecting circuits is at the short-circuit status, another standby micro LED is electrically connected to the second and third pads in the connecting circuit and the connecting wire in the connecting circuit is cut so that the second pad is electrically insulated from the third pad.

According to one or more embodiment, the disclosure provides another repairing method for a display panel. The display panel includes a circuit substrate and micro LEDs. The circuit substrate includes connecting circuits. Respective one of the connecting circuits is electrically connected to respective one of the micro LEDs, a first wire and a second wire. Each of the connecting circuits includes a first pad, a second pad, a third pad, a fourth pad, a fifth pad and a connecting wire. The first and fourth pads are electrically connected to the first wire and are respectively located at the two sides of the first wire. The third and fifth pads are electrically connected to the second wire and are respectively located at the two sides of the first wire. The two terminals of the connecting wire are respectively connected to the second and third pads. The corresponding micro LED is bonded to the first and second pads. In the repairing method, a test signal is supplied to at least one of the connecting circuits to drive the corresponding micro LED for operation. Then, check whether one of the micro LEDs is at a normal status, an open-circuit status or a short-circuit status. When one of the micro LEDs is at the open-circuit status, a standby micro LED is bonded to the fourth and fifth pads. When one of the micro LEDs is at the short-circuit status, another standby micro LED is bonded to the fourth and fifth pads.

According to one or more embodiments, the disclosure provides another display panel which includes micro LEDs and a circuit substrate. The micro LEDs are boned on the circuit substrate and are separated from each other. The circuit substrate includes first wires, second wires and connecting circuits. Respective one of the connecting circuits is configured to be electrically connected to respective one of the micro LEDs. Each of the connecting circuits includes a connecting wire, a first pad, a standby pad and a second pad. One terminal of the connecting wire is electrically connected to one of the first wires. The first pad is electrically connected to the other terminal of the connecting wire. The first pad is electrically connected to the first electrode of the corresponding micro LED. The standby pad is electrically connected to the first wire electrically connected to the connecting wire. The standby pad and the first pad are respectively located at the two terminals of the connecting wire. The second pad is electrically connected to one of the second wires. The second pad is electrically connected to the second electrode of the corresponding micro LED.

According to one or more embodiments, the disclosure provides another repairing method for a display panel. The display panel includes a circuit substrate and micro LEDs. The circuit substrate includes sub pixel regions. Each of the sub pixel regions has a connecting circuit. The connecting circuit includes a first pad, a second pad, a standby pad and a connecting wire which are separately disposed. The two terminals of the connecting wire are respectively connected to the first pad and the standby pad. The first pad and the standby pad are electrically connected to one of first wires. The second pad is electrically connected to one of second wires. In the repairing method, a test signal is supplied to at least one of the connecting circuits to drive the corresponding micro LED for operation. Then, check whether one of the micro LEDs is at a normal status, an open-circuit status or a short-circuit status. When one of the micro LEDs is at the open-circuit status, a standby micro LED is correspondingly bonded to the standby pad and the second pad. When one of the micro LEDs is at the short-circuit status, another standby micro LED is correspondingly bonded to the standby pad and the second pad and the connecting wire in the connecting circuit corresponding to the micro LED is disconnected so that the first pad is electrically insulated from the first wire.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

Figure 1A:
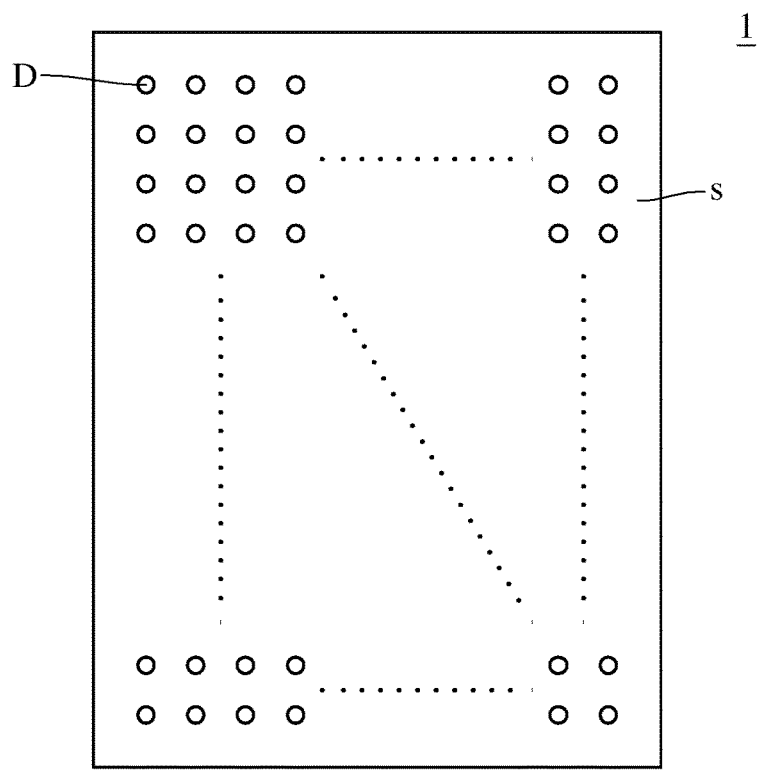
FIGS. 1A~1B illustrate the schematic structures of a display panel and a circuit substrate thereof according to an embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 1B:
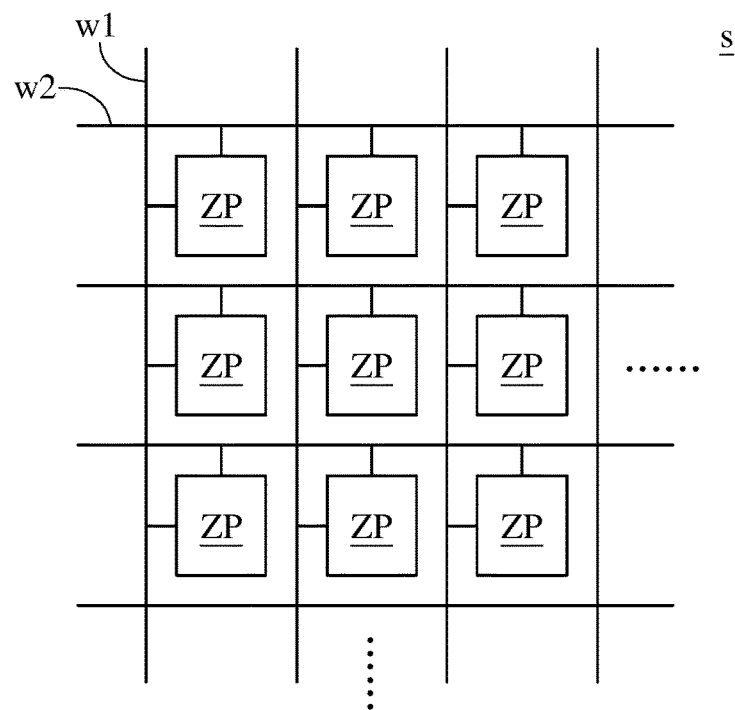

Please refer to FIGS. 1A and 1B to illustrate the structure of a display panel 1 according to an embodiment of the disclosure. Note that, for easy description, the following description is based on only a part of components in the display panel; and however, the disclosure is not limited to the amounts of respective components in the display panel or the position relationship of all of the components.

As shown in FIG. 1A, the display panel 1 includes LEDs D and a circuit substrate S. Here, the disclosure does not intend to limit the size, color and manufacture of the LED D. In an embodiment, the LED D is a micro LED, but the disclosure is not limited thereto. The LEDs D are disposed on the circuit substrate S and separate from each other. The LEDs D respectively emit red, blue and green light. In another embodiment, the LEDs D respectively emit red, blue, green and white light.

As shown in 1B, the circuit substrate S includes first wires w1, second wires w2 and connecting circuits (shown in the other drawing). On the circuit substrate S, sub pixel regions ZP are defined, and respective one of the LEDs D is disposed in respective one of the sub pixel regions ZP. The first wires w1 and the second wires w2 are made of, for example, metal, indium tin oxide (ITO), indium gallium zinc oxide (IGZO) or indium tin zinc oxide (ITZO). The first wires w1 do not contact and are electrically insulated from the second wires w2.

Respective one of the connecting circuits is disposed in respective one of the sub pixel regions ZP on the circuit substrate S, and is electrically connected to respective one of the first wires w1 and respective one of the second wires w2. Respective one of the connecting circuits is electrically connected to respective one of the LEDs D. In other words, a respective connecting circuit functions as a pixel circuit in a respective sub pixel region. Note that the sub pixel regions ZP shown in FIG. 1B are located in rectangular spaces formed by crossing two first wires w1 with two second wires w2; but in practice, the shape or area of a respective sub pixel region may be contingent upon a variety of display panels.

Figure 2A:
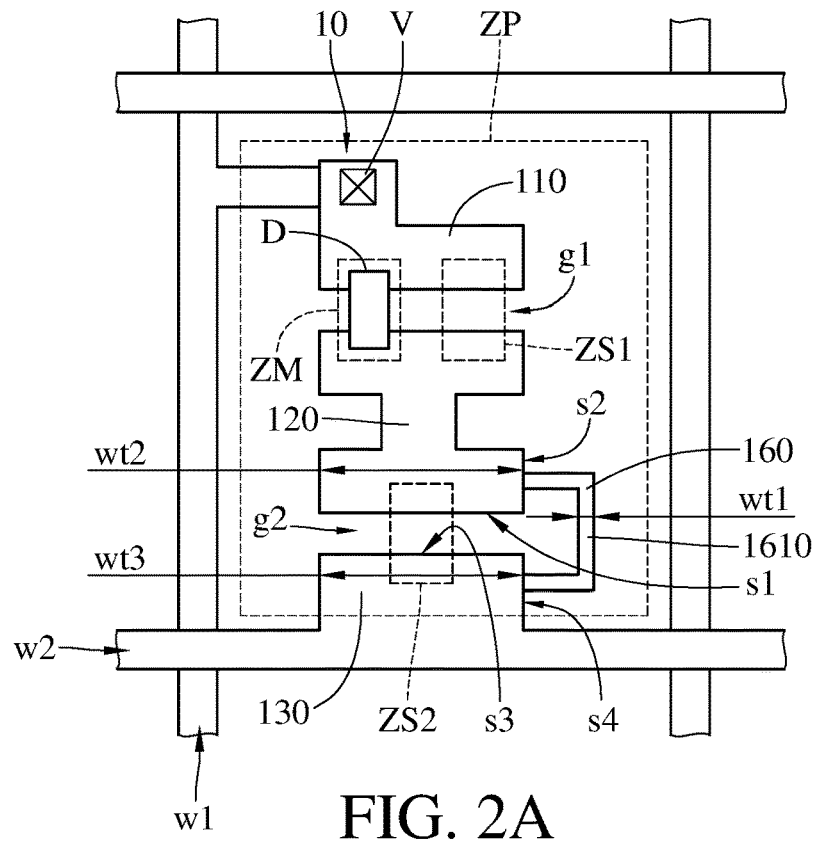
FIGS. 2A~2C illustrate structures of various connecting circuits for a display panel according to a first embodiment of the disclosure.

Refer to FIG. 2A, a connecting circuit 10 in the first embodiment of the display panel 1 includes a first pad 110, a second pad 120, a third pad 130 and a connecting wire 160. The first pad 110 is electrically connected to one of the first wires w1. In this embodiment, the first pad 110 is electrically connected to the corresponding first wire w1 through a via V. The third pad 130 is electrically connected to one of the second wires w2. Note that the connecting circuit 10 in the sub pixel region ZP in this embodiment is connected to the first wire w1 located at the left side of the sub pixel region ZP and the second wire w2 located below the sub pixel region ZP. One of ordinary skill in the art can understand that the position relationship of the components in the sub pixel region ZP is contingent upon actual requirements and is not limited to a certain position relationship as long as respective one of them is connected to respective one of the first wires w1 and respective one of the second wires w2.

The first pad 110 is electrically connected to the first electrode of the corresponding LED D. The first pad 110 and the second pad 120 have a first gap g1 therebetween. The width of the first gap g1 is not larger than the distance between the two electrodes of the LED D. The second pad 120 is electrically connected to the second electrode of the corresponding LED D. The second pad 120 and the third pad 130 have a second gap g2 therebetween. The second pad 120 is located between the first pad 110 and the third pad 130. The connecting wire 160 is connected to the second pad 120 and the third pad 130.

In detail, a primary connecting region ZM, a first alternative connecting region ZS1 and a second alternative connecting region ZS2 are further defined in the sub pixel region ZP. The primary connecting region ZM is a region where the LED D is connected to the first pad 110 and the second pad 120. The primary connecting region ZM does not overlap the first alternative connecting region ZS1. The primary connecting region ZM covers a part of the first pad 110 and a part of the second pad 120. The first alternative connecting region ZS1 covers the other part of the first pad 110 and the other part of the second pad 120. The second alternative connecting region ZS2 covers a part of the second pad 120 and the third pad 130.

On the other hand, the connecting wire 160 includes a cutting portion 1610 to be cut. The cutting portion 1610 has a width wt1 that is shorter than the width wt2 of the second pad 120 and the width wt3 of the third pad 130. The related details will be explained later.

In practice, the circuit substrate S may be manufactured in the beginning of a manufacturing process. In this case, the connecting circuit in a respective sub pixel region of the circuit substrate S is, for example, the structure as shown in FIG. 2A. Then, a respective LED D is bonded in the primary connecting region ZM on the circuit substrate S, so as to form an initially-finished product for a display panel. However, a short-circuit defect or an open-circuit defect may occur during bonding, so a related repairing method can be performed to eliminate the short-circuit defect or the open-circuit defect and then enhance the yield rate of display panels. The repairing of the primary connecting region ZM having an open-circuit defect and the repairing of the primary connecting region ZM having a short-circuit defect will respectively be explained later.

In the case where the sub pixel region ZP has an open-circuit defect, how to eliminate the open-circuit defect in the embodiment shown in FIG. 2A is explained with reference to FIG. 2B. In a broad sense, the so-called open-circuit defect exemplarily means that the first pad 110 is still electrically insulated from the second pad 120 after the LED D is disposed in the sub pixel region ZP. That is, even though the display panel 1 is powered, the LED D disposed in the sub pixel region ZP cannot emit light. In this case, a standby micro LED Db1 can be disposed on the first pad 110 and the second pad 120 in the first secondary connecting region ZS1, and then the problem that the sub pixel region ZP cannot illuminate because of the open circuit, can be resolved. The sub pixel region ZP is restored to normally illuminate through the standby micro LED Db 1.

In the case where the sub pixel region ZP has a short-circuit defect, how to eliminate the short-circuit defect in the embodiment shown in FIG. 2A is explained with reference to FIG. 2C. In a broad sense, the short-circuit defect exemplarily means that the first pad 110 is electrically connected to the second pad 120 without the LED D after the LED D is disposed in the sub pixel region ZP. In this situation, the LED D in the primary connecting region ZM cannot normally light up. As shown in FIG. 2C, a second alternative connecting region ZS2 is defined in the sub pixel region ZP. A standby LED Db2 is disposed in the second alternative connecting region ZS2. Moreover, the cutting portion 1610 of the connecting wire 160 is cut. When the two electrodes of the standby micro LED Db2 are respectively and electrically connected to the second pad 120 and the third pad 130 in the second alternative connecting region ZS2 and the connecting wire 160 has been disconnected, then it is possible to eliminate the short-circuit defect in the sub pixel region ZP and the sub pixel region ZP is possibly restored to normally illuminate.

In practice, the connecting wire 160 can be disconnected by laser light, a chemical etching or a mechanical matter, but the disclosure is not limited thereto. As described above, the width wt1 of the cutting portion 1610 is shorter than the width wt2 of the second pad 120 and the width wt3 of the third pad 130. That is, the width wt1 is relatively narrow so that the cutting portion 1610 may easily be cut off. In this embodiment, the entire connecting wire 160 substantially has the same width, so any position on the connecting wire 160 can be the cutting portion 1610. In other words, the location of the cutting portion 1610 is not limited to the position shown in FIG. 2C in this embodiment.

In the drawing, the second pad 120 has a first edge s1 and a second edge s2, the third pad 130 has a third edge s3 and a fourth edge s4. In this embodiment, the first edge s1 connects to the second edge s2, and the third edge s3 connects to the fourth edge s4. The first edge s1 and the second edge s2 are not collinear, and the third edge s3 and the fourth edge s4 are not collinear. The second gap g2 is located between the first edge s1 and the third edge s3. The two terminals of the connecting wire 160 are respectively connected to the second edge s2 of the second pad 120 and the fourth edge s4 of the third pad 130. The connecting wire 160 is located outside the second gap g2 so that the connecting wire 160 can have a suitable bended shape for easy disconnection. Moreover, since the connecting wire 160 is located outside the second gap g2, the other structures of the connecting circuit 10 or the other components in the sub pixel region ZP may not be damaged during the cutting of the connecting wire 160. In some embodiments, the connecting wire is located inside the second gap and the two terminals of the connecting wire are respectively connected to the first edge of the second pad and the third edge of the third pad, and thus, the manufacturing cost may be saved.

Figure 2B:
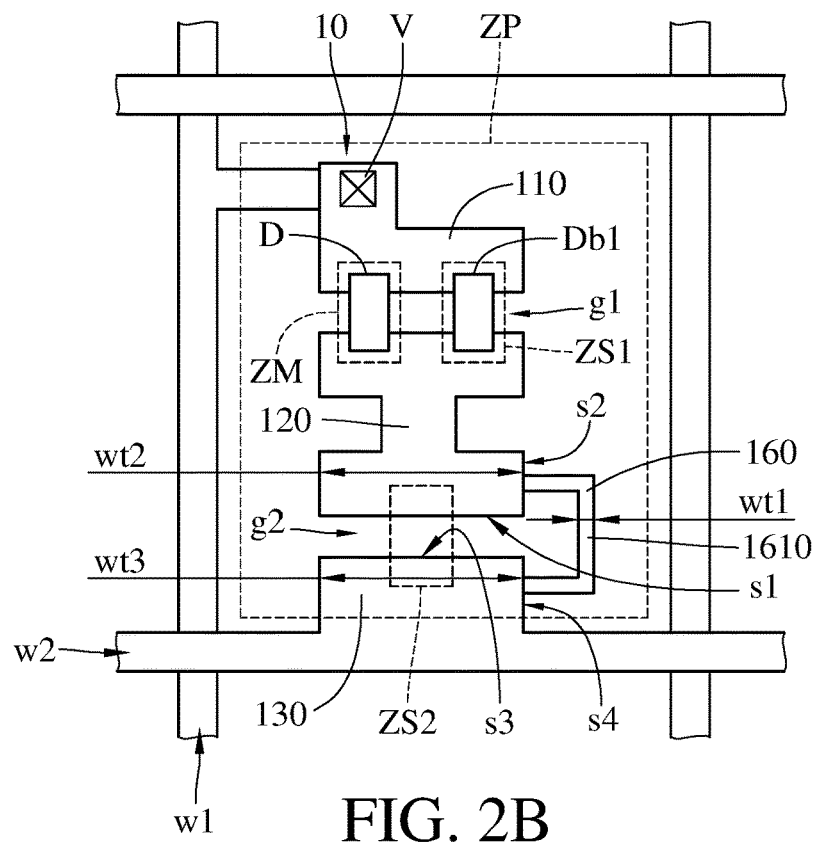
Figure 2C:
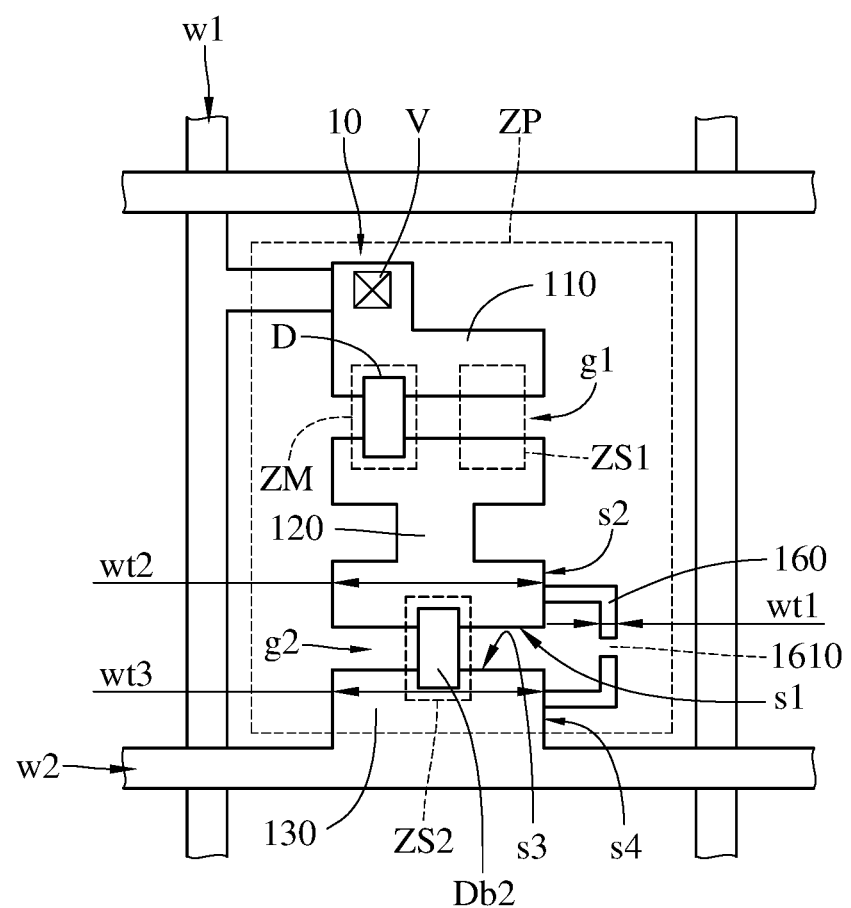
Figure 3:
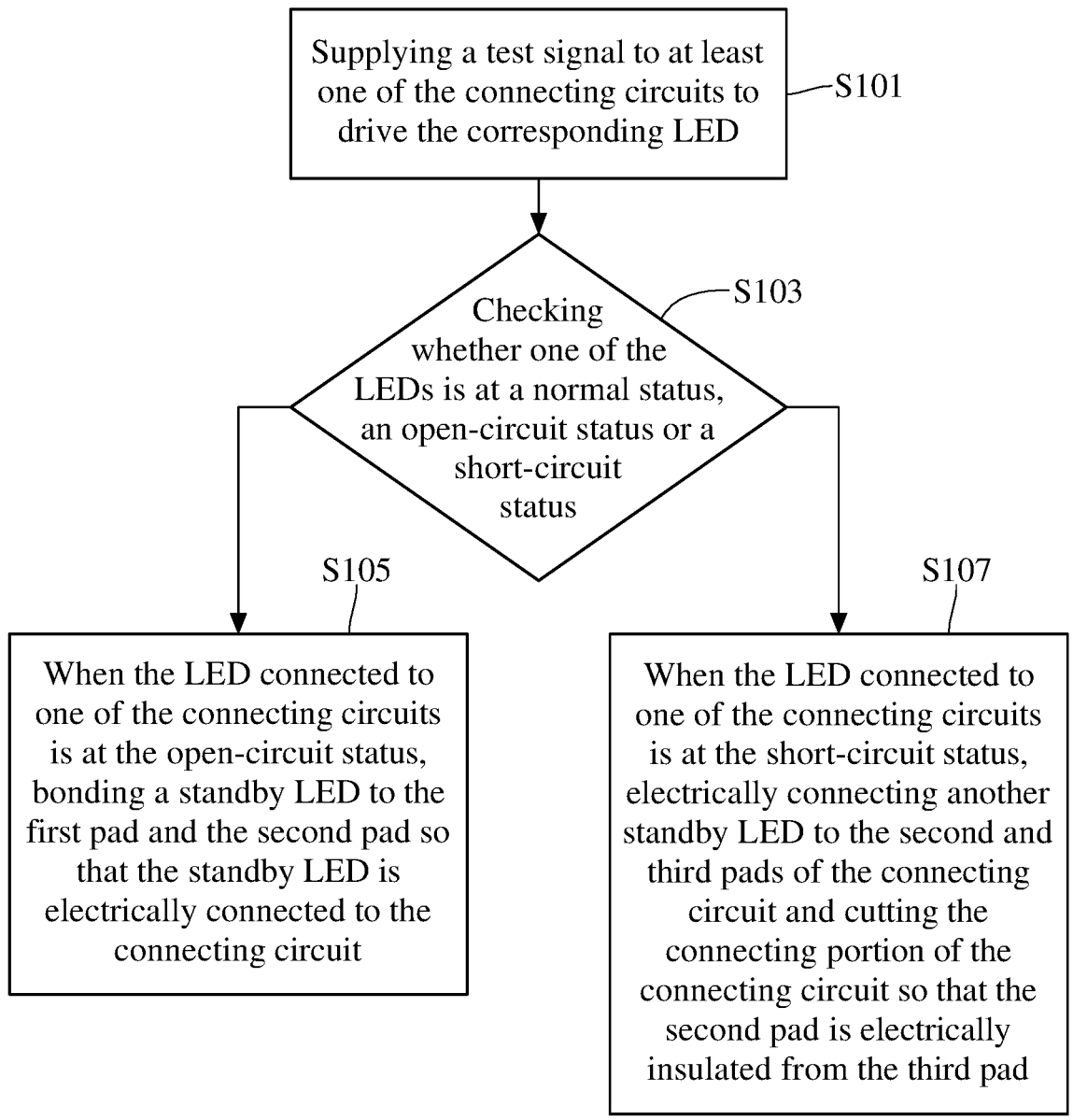
FIG. 3 is a flow chart of a repairing method for a display panel according to an embodiment.

Please refer to FIG. 3 which is a flow chart of a repairing method for a display panel according to an embodiment. The display panel includes a circuit substrate and micro LEDs. In the case of the display panel and the circuit substrate shown in FIG. 1 and FIGS. 2A~2C, after the micro LEDs are respectively bonded in the primary connecting regions of all the sub pixel regions on the circuit substrate, step S101 is performed to supply a test signal to at least one of the connecting circuits to drive the corresponding micro LED for operation. Step S103 is performed to check whether one of the micro LEDs in each sub pixel region to determine whether the micro LED is at a normal status, an open-circuit status or a short-circuit status. When it is determined that one micro LED in one of the connecting circuits is at the open-circuit status, step S105 is performed to bond a standby micro LED in the first alternative connecting region so that the standby micro LED is electrically connected to the first pad and the second pad. When it is determined that one micro LED in one of the connecting circuits is at the short-circuit status, step S107 is performed to cut the connecting wire in the connecting circuit (i.e. the second pad is electrically insulated from the third pad) and electrically connect another standby micro LED to the second pad and the third pad in the connecting circuit (i.e. second alternative connecting region).

In an embodiment, a part or all of sub pixel units in the display region of the display panel can be selected to light up in step S101. A respective sub pixel unit having a short-circuit defect or an open-circuit defect can be determined by determining whether the sub pixel unit illuminates in an expected mode. The detailed determination can be freely designed by one of ordinary skill in the art according to the circuit layout of the display panel, characteristics of components of the display panel or test algorithm(s) of the display panel, and the disclosure does not intend to limit how to determine the normal status, the open-circuit defect or the short-circuit defect. In another embodiment, all sub pixel units in the display region of the display panel can light up to determine whether a dark spot exists in screen. When a dark spot exists in screen, then whether the micro LED is electrically connected to the related pads well is determined by observing the micro-structure of the display panel using an electron microscope.

Accordingly, as described above, the connecting circuits in different sub pixel regions on the circuit substrate may have the structures shown in FIG. 2A to FIG. 2C when the display panel leaves from the factory. In more detail, ideally, respective micro LEDs should be bonded to a circuit substrate well in the manufacturing process (i.e. the normal status), so the connecting circuit in a respective sub pixel region has the structure shown in FIG. 2A. When an open-circuit defect is caused by bonding some micro LEDs to corresponding sub pixel regions not well in the manufacturing process, the display panel will be repaired to have the structure shown in FIG. 2B. When a short-circuit defect is caused by bonding some micro LEDs to corresponding sub pixel regions not well in the manufacturing process, the display panel will be repaired to have the structure shown in FIG. 2C. Therefore, the structures of bonding micro LEDs and connecting circuits together in some sub pixel regions in the same display panel may have one or more of the structures shown in FIGS. 2A~2C.

Figure 4A:
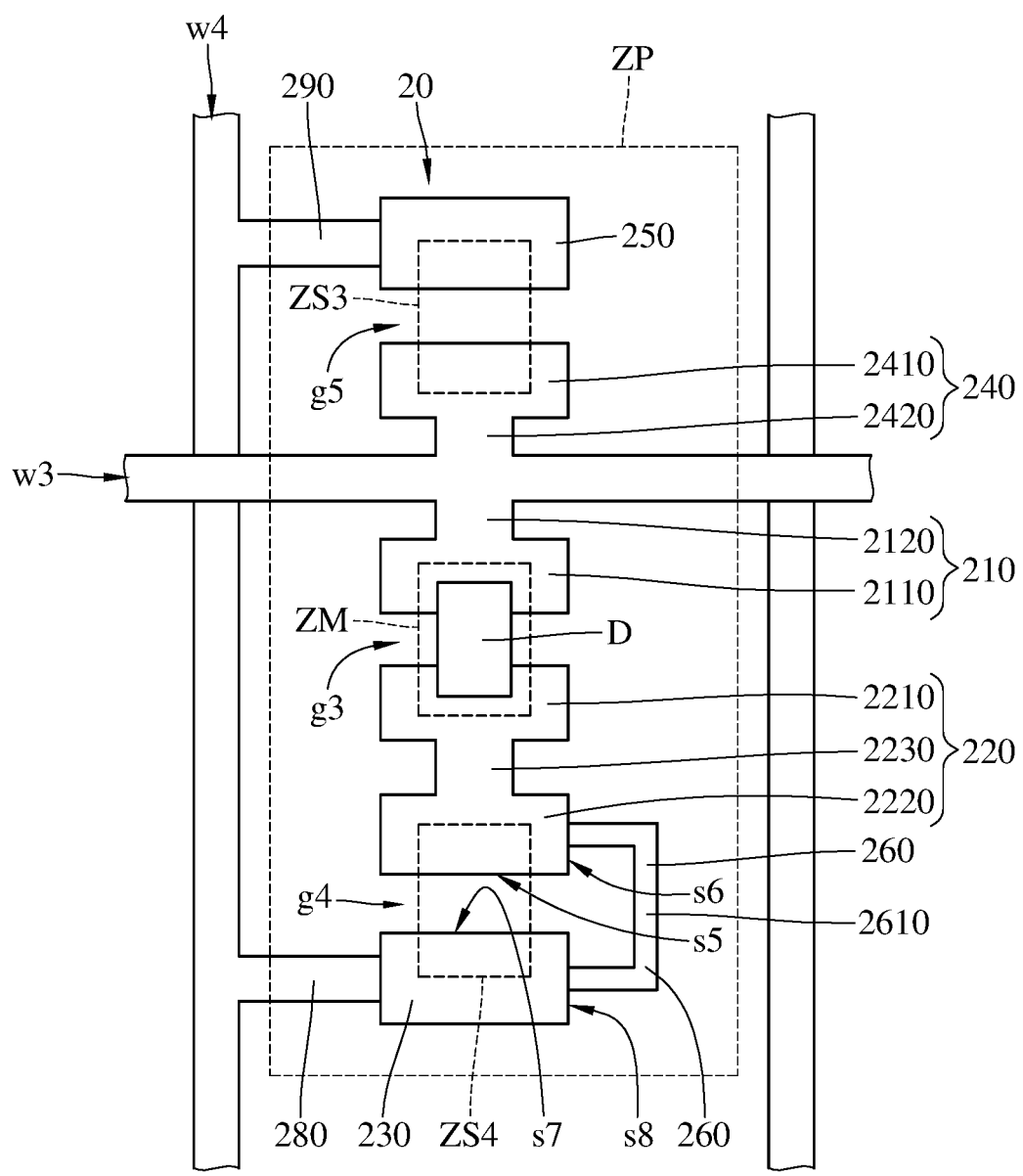
FIGS. 4A~4C illustrate structures of various connecting circuits for a display panel according to a second embodiment of the disclosure.

Please refer to FIG. 4A for another embodiment of the connecting circuit. FIG. 4A illustrates the structures of a connecting circuit in a display panel according to a second embodiment of the disclosure. In this embodiment, the structure of the display panel except the connecting circuits is similar to the above embodiment and the explanations of the similar portions (such as the foregoing substrate, layout, micro LEDs, etc.) between this and the above embodiments are omitted. In FIG. 4A, the connecting circuit 20 includes a first pad 210, a second pad 220, a third pad 230, a fourth pad 240, a fifth pad 250 and a connecting wire 260. The first pad 210 and the fourth pad 240 are electrically connected to the same first wire w3 and are respectively disposed at two opposite sides of the first wire w3.

The fifth pad 250 is electrically connected to the second wire w4 connected to the third pad 230. The fourth pad 240 and the fifth pad 250 have a fifth gap g5 therebetween. The first pad 210, the second pad 220 and the third pad 230 are located at one side of the first wire w3, the fourth pad 240 and the fifth pad 250 are located at the other side of the first wire w3, and the fourth pad 240 is closer to the first wire w3 than the fifth pad 250.

Similar to the first embodiment, the sub pixel region ZP in this embodiment includes a primary connecting region ZM. The primary connecting region ZM includes a part of the first pad 210 and a part of the second pad 220. In the primary connecting region ZM, one of the LEDs D is correspondingly disposed. In the sub pixel region ZP, alternative connecting regions ZS3 and ZS4 are further defined, and the primary connecting region ZM and the alternative connecting regions ZS3 and ZS4 do not overlap each other. The alternative connecting region ZS3 covers a part of the fourth pad 240 and a part of the fifth pad 250, and the alternative connecting region ZS4 covers a part of the second pad 220 and a part of the third pad 230.

Figure 4B:
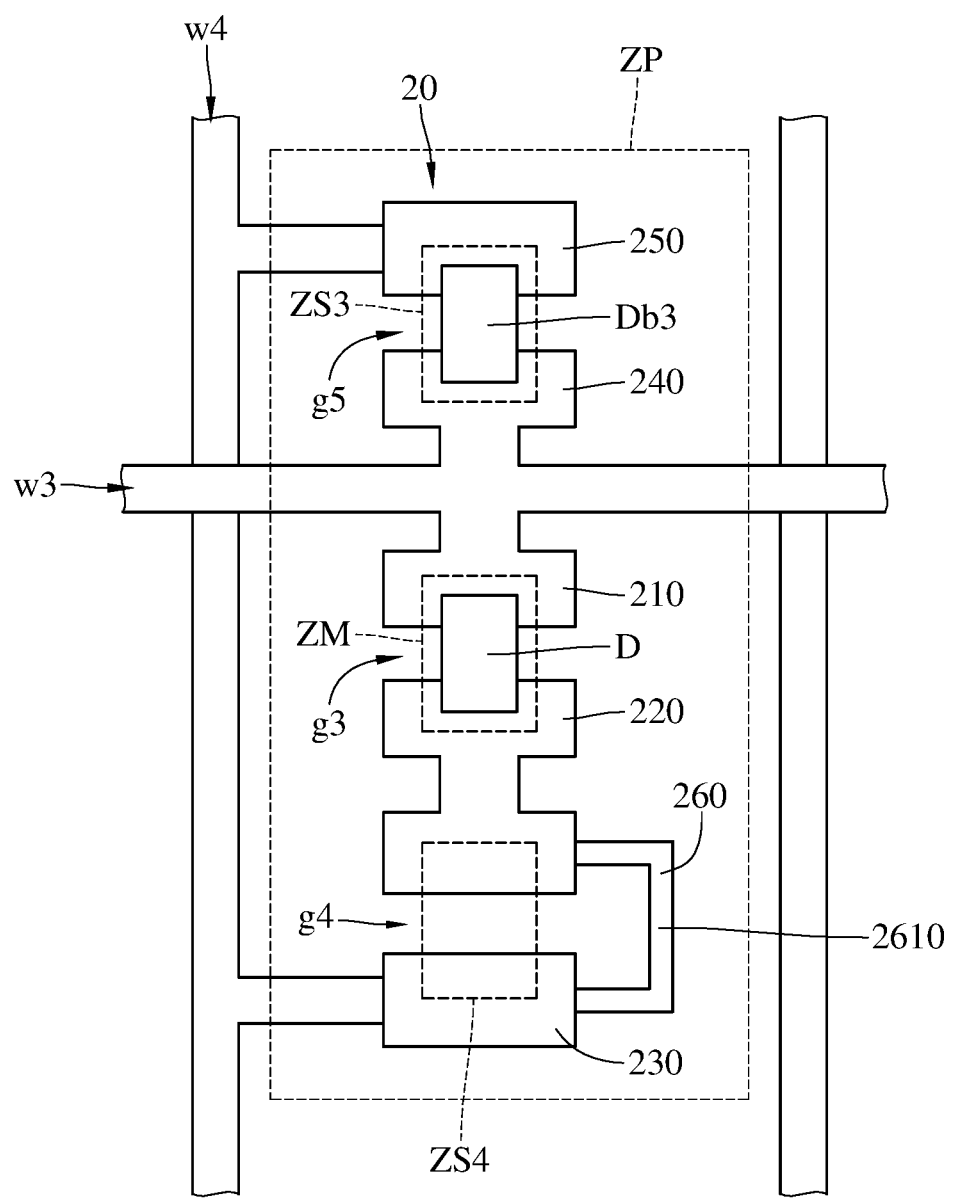

Next, refer to FIG. 4B to illustrate how to eliminate an open-circuit defect existing in the sub pixel region in the second embodiment shown in FIG. 4A. FIG. 4B illustrates the structure of the connecting circuit in the repaired display panel according to the second embodiment of the disclosure. When an open circuit occurs to the LED D in the sub pixel region ZP in FIG. 4A, a standby micro LED Db3 is disposed in the alternative connecting region ZS3 and the two electrodes of the standby micro LED Db3 are respectively and electrically connected to the fourth pad 240 and the fifth pad 250 in the alternative connecting region ZS3.

Figure 4C:
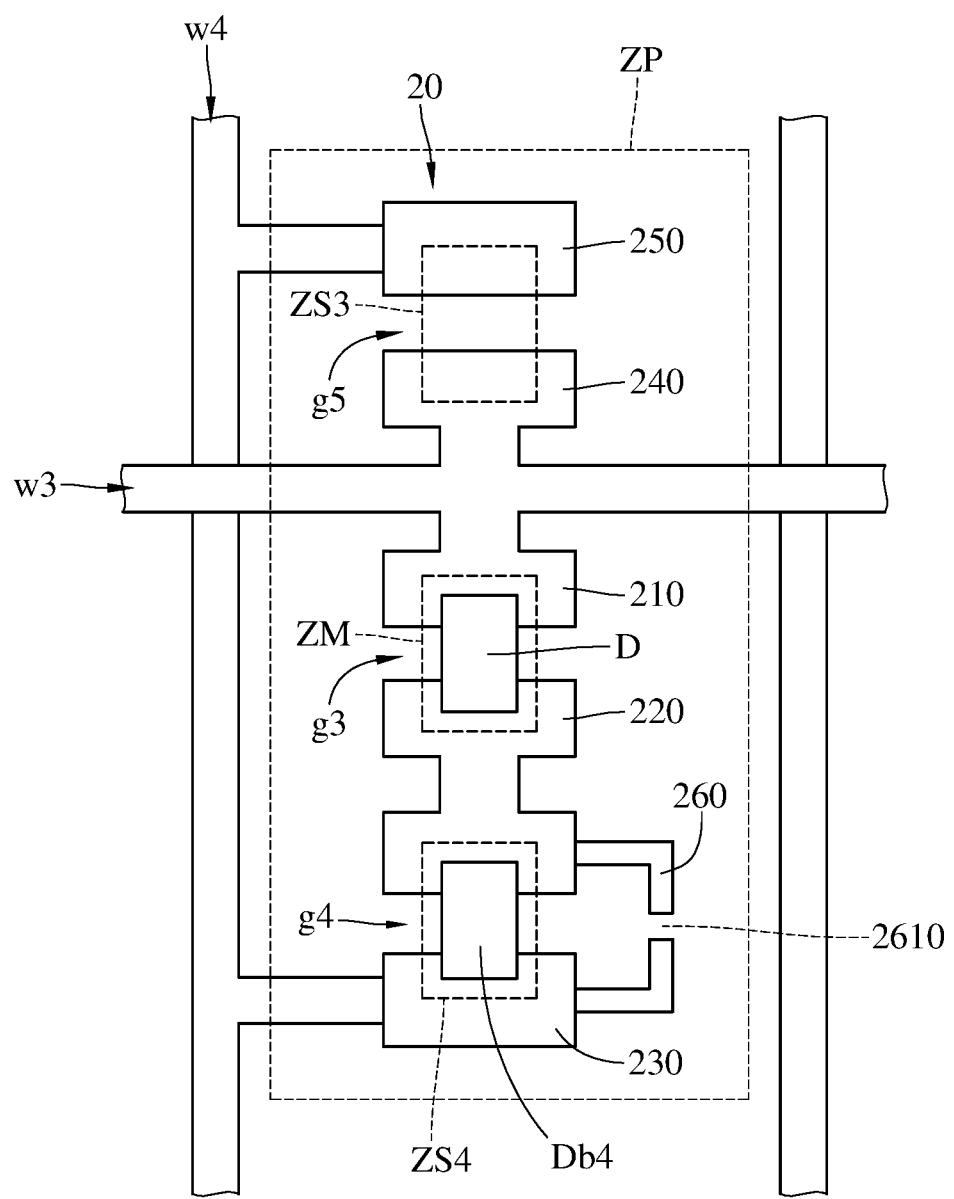

Also, refer to FIG. 4C to explain how to eliminate a short-circuit defect existing in the sub pixel region in the second embodiment shown in FIG. 4A. FIG. 4C illustrates another structure of the connecting circuit in the repaired display panel according to the second embodiment of the disclosure. When a short circuit occurs to the LED D in the sub pixel region ZP in the embodiment shown in FIG. 4A, another standby micro LED Db4 is disposed in the alternative connecting region ZS4, the two electrodes of the standby micro LED Db4 are respectively and electrically connected to the second pad 220 and the third pad 230 in the alternative connecting region ZS4, and the cutting portion 2610 is cut off from the connecting wire 260.

Please return to FIG. 4A for the explanation of the detailed structure of the connecting circuit. The first pad 210 includes a pad segment 2110 and a connecting segment 2120, and the pad segment 2110 connects to the first wire w3 through the connecting segment 2120. The fourth pad 240 includes a pad segment 2410 and a connecting segment 2420, and the pad segment 2410 connects to the first wire w3 through the connecting segment 2420. The widths of the connecting segments 2120 and 2420 are shorter than the widths of the pad segments 2110 and 2410. The second pad 220 includes pad segments 2210 and 2220 and a connecting segment 2230. The two terminals of the connecting segment 2230 respectively connect to the pad segments 2210 and 2220. The width of the connecting segment 2230 is shorter than the widths of the pad segments 2210 and 2220. The third pad 230 connects to the second wire w4 through the connecting wire 280, and the fifth pad 250 connects to the second wire w4 through the connecting wire 290. The widths of the connecting wires 280 and 290 are shorter than the widths of the pads 230 and 250. On the other hand, the pad segment 2220 of the second pad 220 has a fifth edge s5 and a sixth edge s6, and the third pad 230 has a seventh edge s7 and an eighth edge s8. The fifth edge s5 faces the seventh edge s7, and the second gap g4 is located between the fifth edge s5 and the seventh edge s7. One terminal of the fifth edge s5 connects to the sixth edge s6, and one terminal of the seventh edge s7 connects to the eighth edge s8. The fifth edge s5 and the sixth edge s6 are not collinear, and the seventh edge s7 and the eighth edge s8 are not collinear. The two terminals of the connecting wire 260 respectively connect to the sixth edge s6 and the eighth edge s8.

Figure 5:
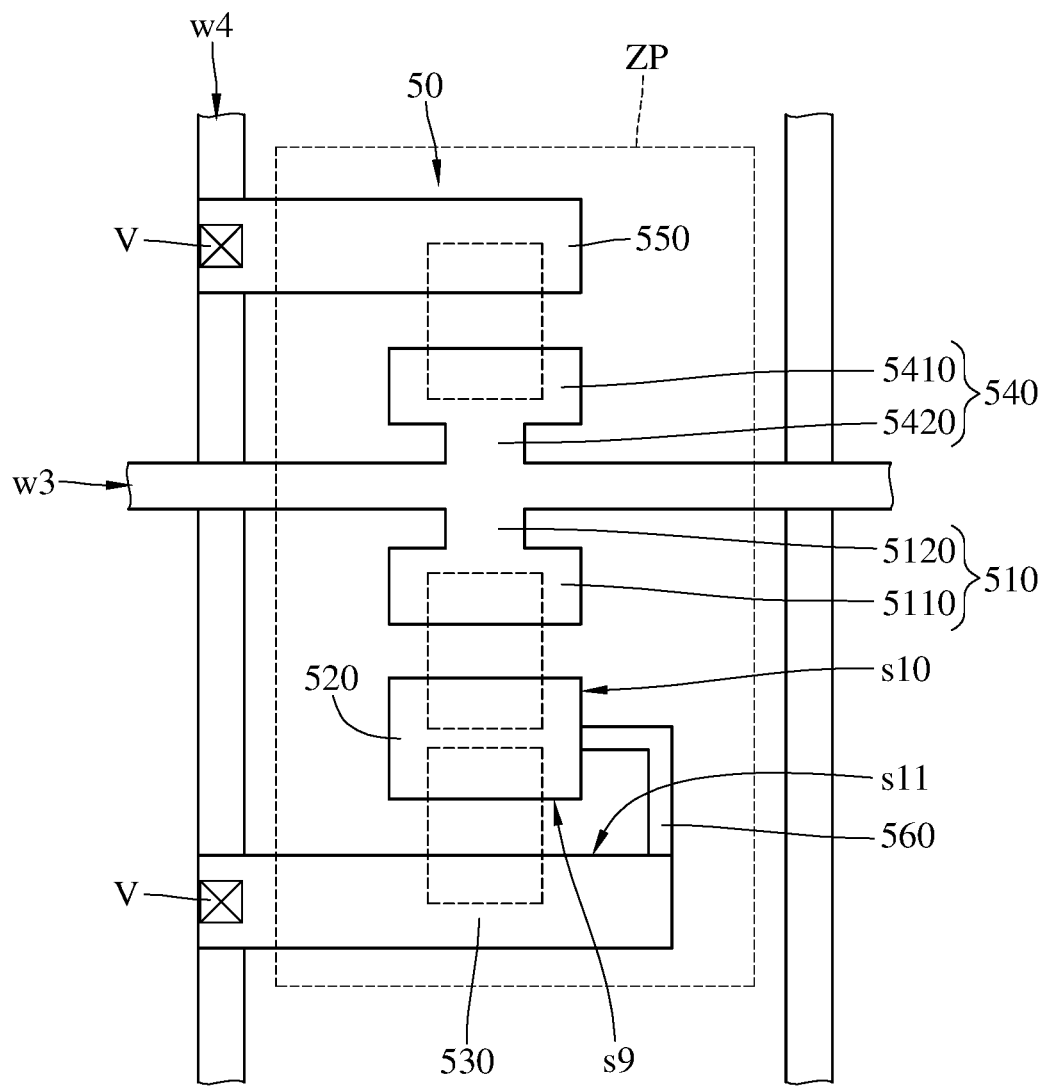
FIG. 5 illustrates the structure of a connecting circuit of the display panel according to a third embodiment of the disclosure.

FIG. 5 illustrates the structure of a connecting circuit of the display panel according to a third embodiment of the disclosure. The structure is similar to the structure of the connecting circuit in FIG. 4A so the same or similar portions therebetween will not be repeated hereafter. Their difference(s) is that in this embodiment, the second pad 520, the third pad 530 and the fifth pad 550 are substantially rectangular. The structure shown in FIG. 5 can reduce the complexity of the connecting circuit and the transmission impedance of the partial structure.

Figure 6:
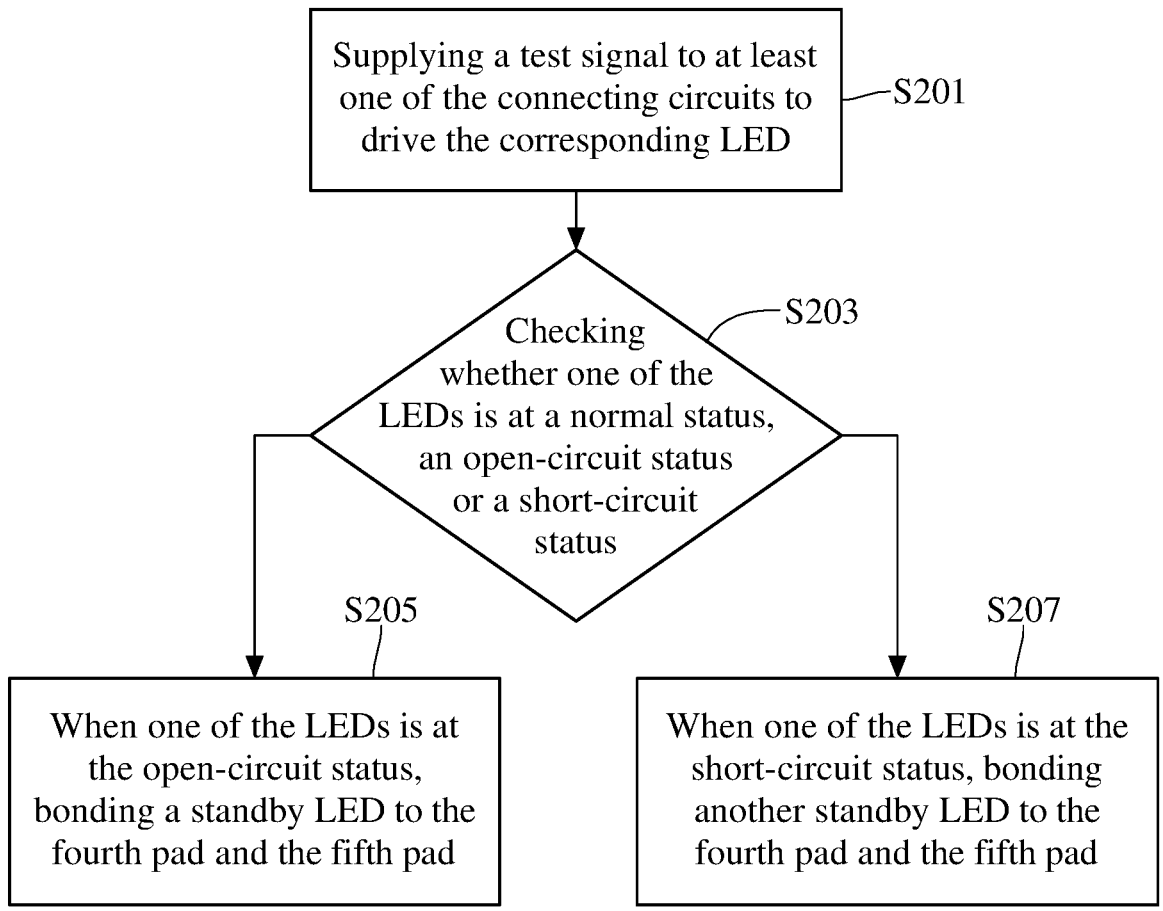
FIG. 6 is a flow chart of a repairing method for the display panel according to another embodiment.

For the embodiments shown in FIG. 4A to FIG. 5, the disclosure provides another repairing method for the display panel. Please refer to FIG. 6 and FIG. 4A. After the LEDs D are respectively bonded in the primary connecting regions of all the sub pixel regions on the circuit substrate, step S201 is performed to supply a test signal to at least one of the connecting circuits to drive the corresponding micro LED for operation. Then, step S203 is performed to check whether one of the micro LEDs can normally illuminates or an open-circuit or a short circuit occurs to the micro LED. When it is determined that an open circuit occurs to the micro LED, step S205 is performed to bond a standby micro LED in the alternative connecting region ZS3 (i.e. electrically connected to the fourth and fifth pads). When a short circuit occurs to the micro LED, step S207 is performed to bond another standby micro LED in another alternative connecting region ZS4 (i.e. electrically connected to the second and third pads).

Figure 7A:
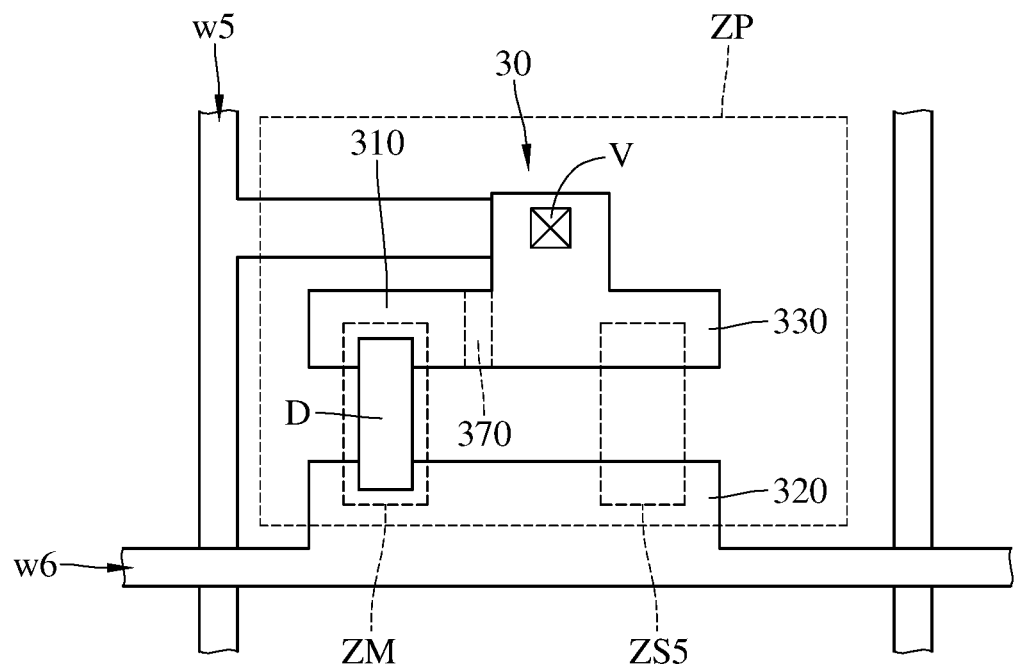
FIG. 7A~7C illustrate structures of various connecting circuits for a display panel according to a fourth embodiment of the disclosure.
Figure 7B:
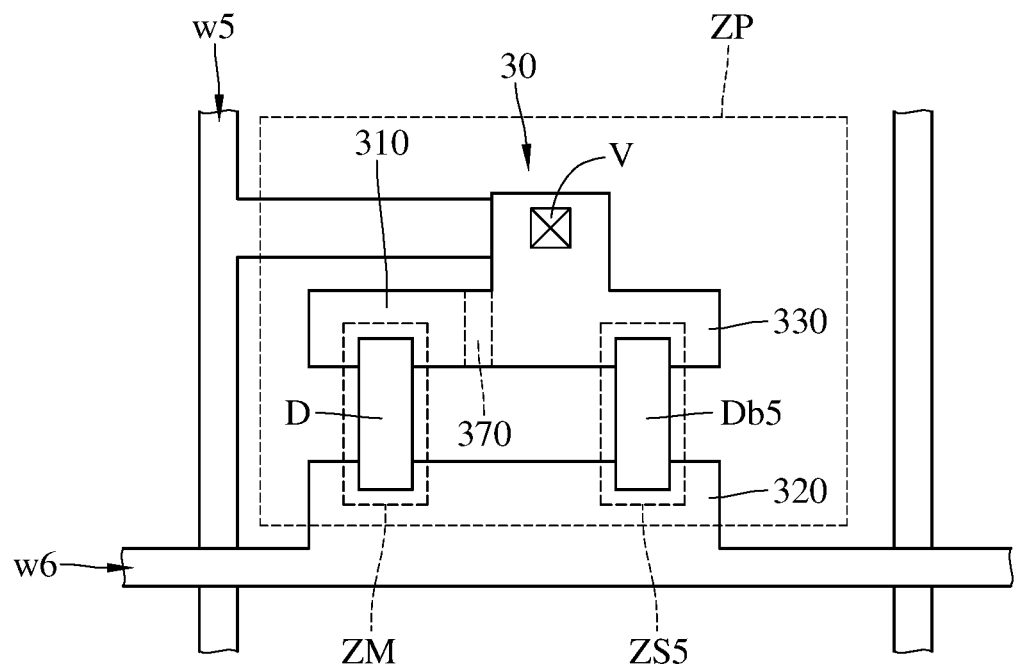
Figure 7C:
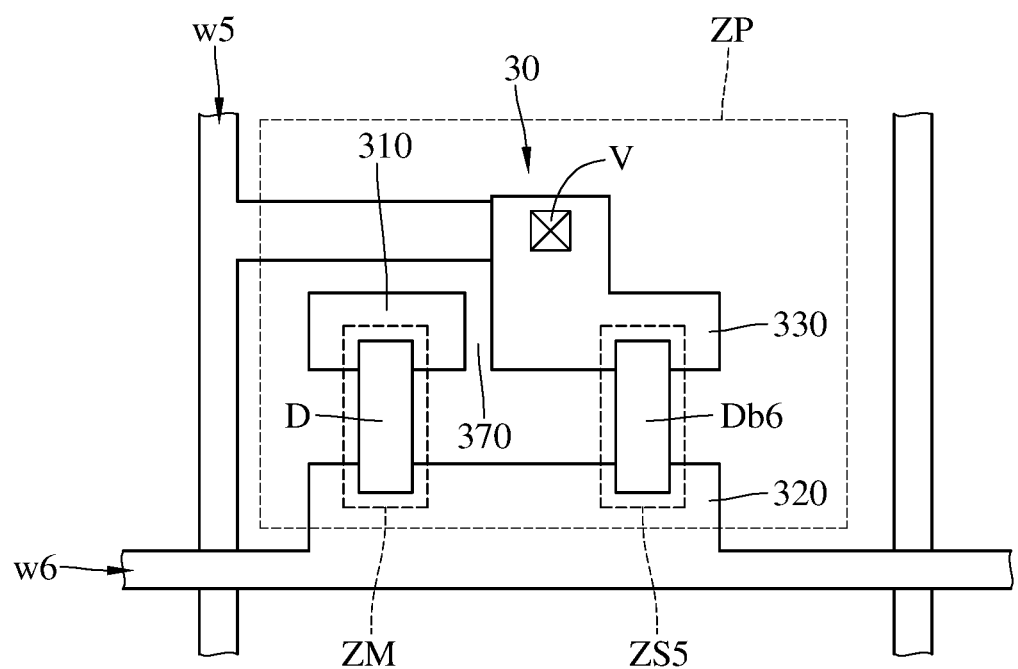

FIGS. 7A~7C illustrate structures of various connecting circuits for a display panel according to a fourth embodiment of the disclosure. In the sub pixel region ZP, a connecting circuit 30 is disposed. The connecting circuit 30 includes a connecting wire 370, a first pad 310, a second pad 320 and a standby pad 330. The connecting wire 370 is respectively and electrically connected to a first wire w5, a first pad 310 and a standby pad 330. The second pad 320 is electrically connected to a second wire w6. The first and second electrodes (not shown) of the corresponding LED D are electrically connected to the first pad 310 and the second pad 320.

In this embodiment, the sub pixel region ZP includes a primary connecting region ZM for the disposition of the LED D and an alternative connecting region ZS5. The primary connecting region ZM does not overlap the alternative connecting region ZS5. The primary connecting region ZM covers a part of the first pad 310 and a part of the second pad 320, and the alternative connecting region ZS5 covers a part of the standby pad 330 and the other part of the second pad 320.

In FIG. 7B, the structure of the repaired sub pixel region ZP in the case where an open circuit occurs to the LED D in the primary connecting region ZM in the embodiment shown in FIG. 7A. A standby micro LED Db5 is disposed in the alternative connecting region ZS5 and is electrically connected to the second pad 320 and the standby pad 330. Therefore, it is possible to resolve the problem that the sub pixel region ZP cannot normally illuminate because of an open circuit occurring to the LED D.

In FIG. 7C, the structure of the repaired sub pixel region ZP in the case where a short circuit occurs to the LED D in the primary connecting region ZM in the embodiment shown in FIG. 7A. A standby LED Db6 is disposed in the alternative connecting region ZS5 and is electrically connected to the second pad 320 and the standby pad 330. Also, the connecting wire 370 is disconnected so that the first pad 310 is electrically insulated from the standby pad 330. Therefore, it is possible to resolve the problem that the sub pixel region ZP cannot normally illuminate because of a short circuit occurring to the LED D.

Figure 8A:
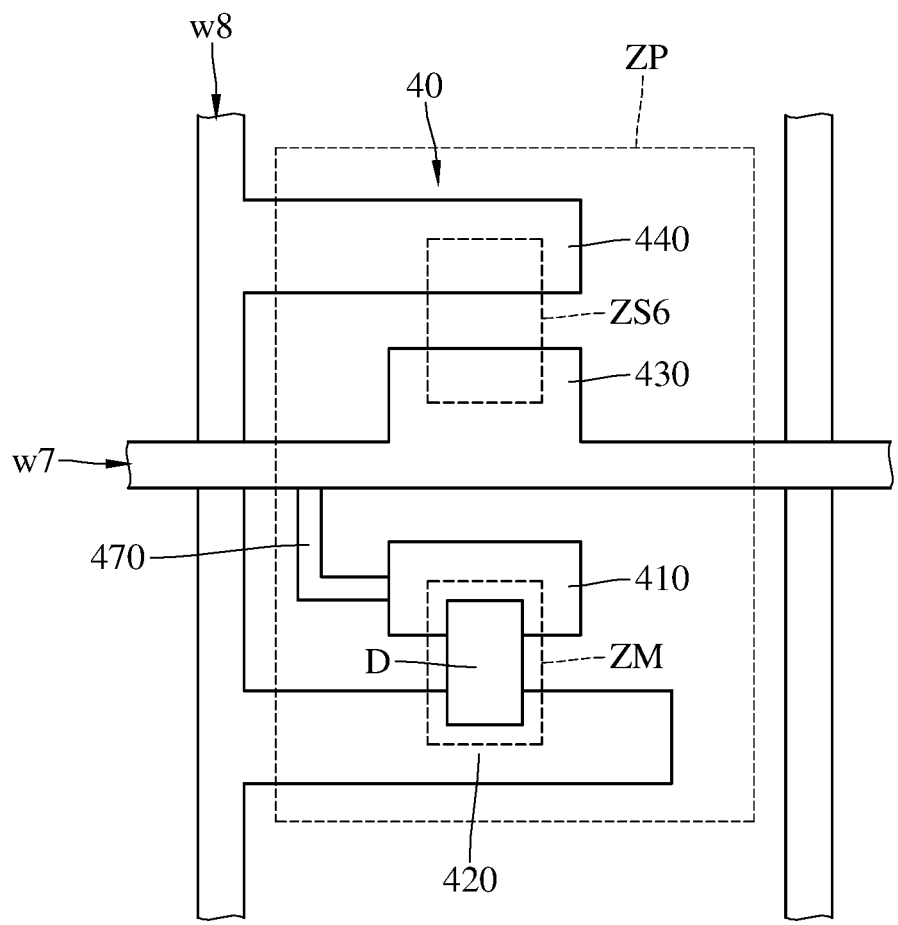
FIG. 8A~8C illustrate structures of various connecting circuits for a display panel according to a fifth embodiment of the disclosure.
Figure 8B:
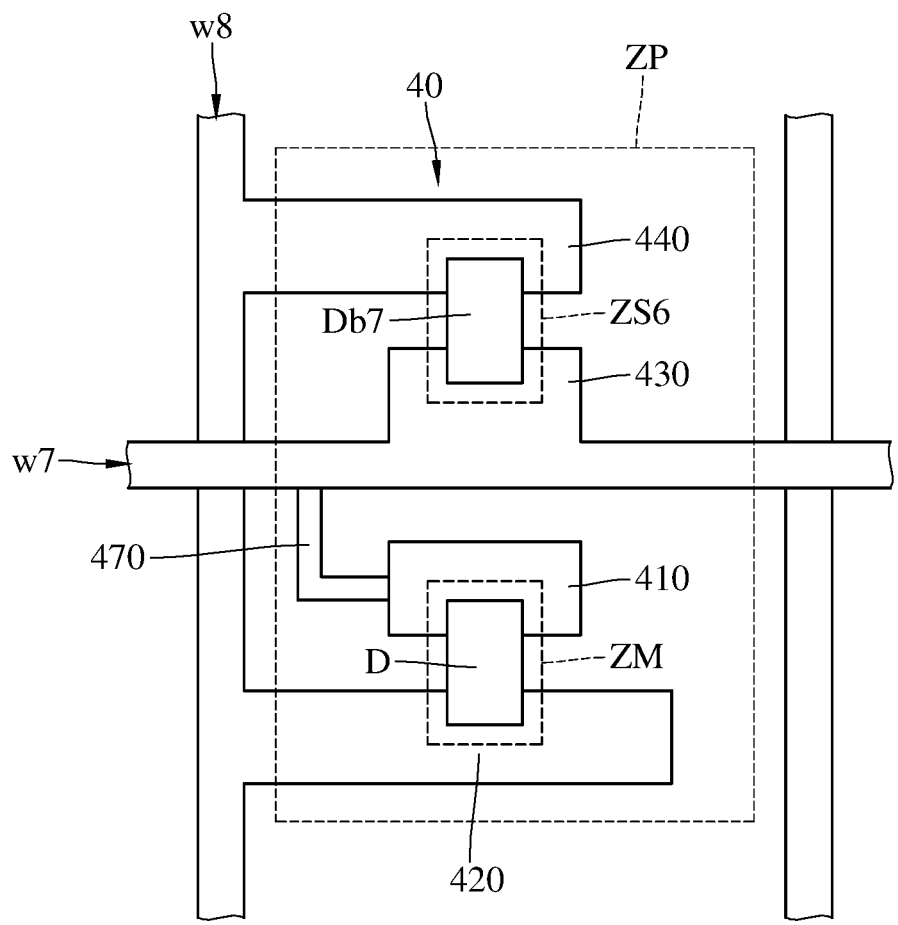
Figure 8C:
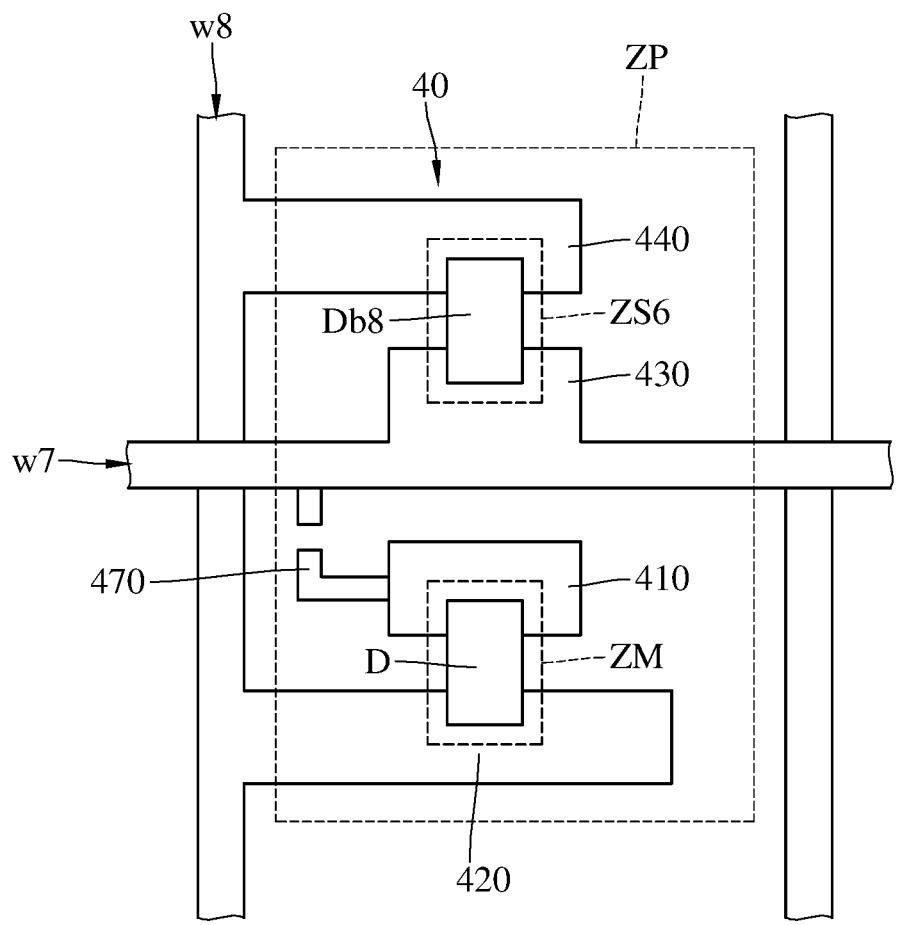

Please refer to FIGS. 8A~8C to illustrate structures of various connecting circuits for a display panel according to a fifth embodiment of the disclosure. The structure of the connecting circuit 40 shown in FIG. 8A is approximately similar to the structure of the connecting circuit 30 shown in FIG. 7A. The differences between the connecting circuit 40 and the connecting circuit 30 are: the connecting circuit 40 further including a fifth pad 440 electrically connected to the second wire W8; the standby pad 430 and the fifth pad 440 being located at one side of the first wire W7 as the connecting wire 470, the first pad 410 and the second pad 420 being located at the other side of the first wire W7; the sub pixel region ZP including a primary connecting region ZM for the disposition of the LED D and an alternative connecting region ZS6; the primary connecting region ZM covering a part of the first pad 410 and a part of the second pad 420; and the alternative connecting region ZS6 covering a part of the standby pad 430 and a part of the fifth pad 440.

In FIG. 8B, the structure of the connecting circuit after repairing is shown. When an open circuit occurs to the LED D in the sub pixel region ZP in the embodiment shown in FIG. 8A, a standby micro LED Db7 is disposed in the alternative connecting region ZS6 and is electrically connected to the fifth pad 440 and the standby pad 430. Therefore, the standby micro LED Db7 replaces the LED D which cannot normally operate since the open circuit occurs thereto.

In FIG. 8C, when a short circuit occurs to the LED D in the sub pixel region ZP in the embodiment shown in FIG. 8A, a standby micro LED Db8 is disposed in the alternative connecting region ZS6 and is electrically connected to the fifth pad 440 and the standby pad 430. Moreover, the connecting wire 470 is disconnected so that the first pad is electrically insulated from the first wire w7. Therefore, the standby micro LED Db7 replaces the LED D which cannot normally operate since the short circuit occurs thereto.

Figure 9:
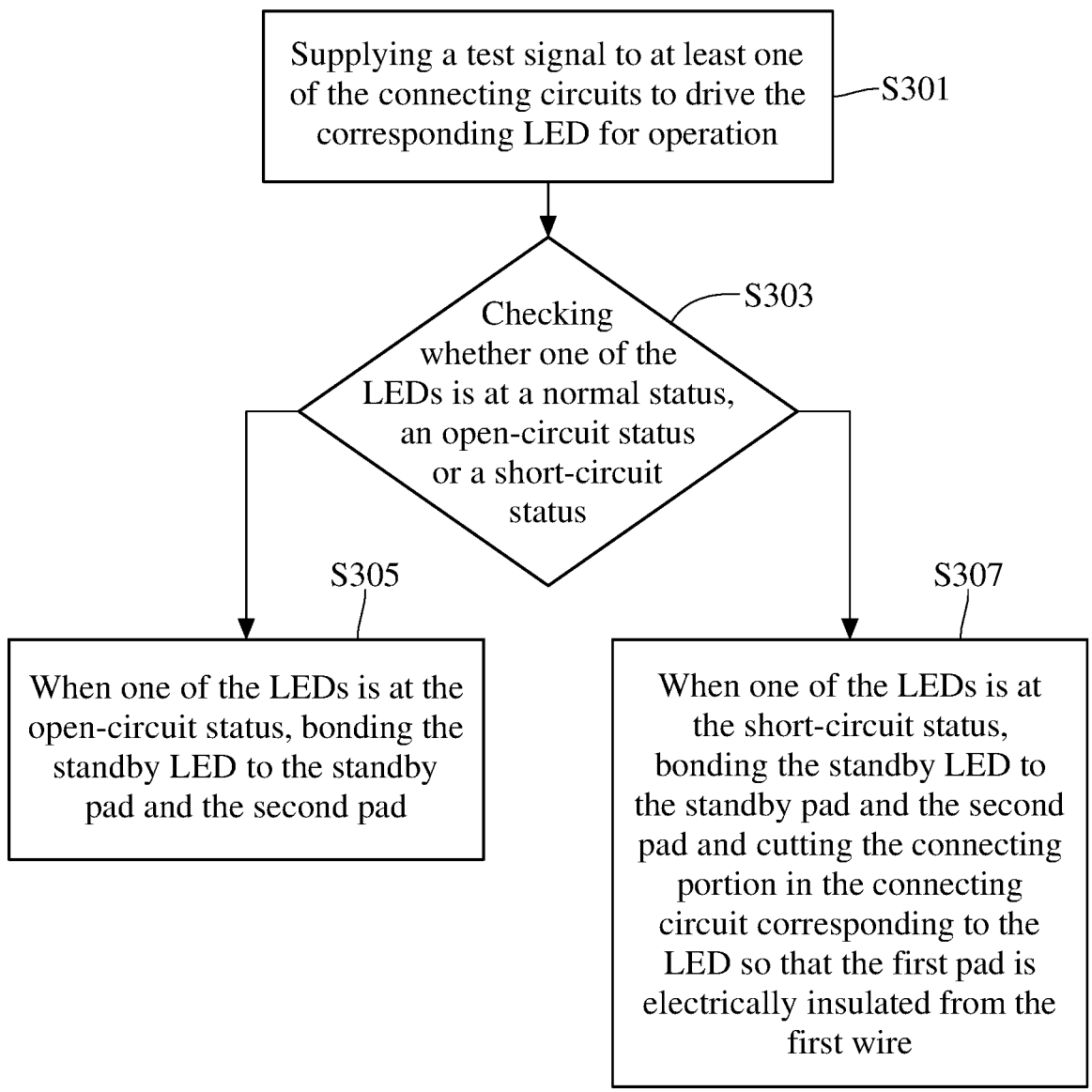
FIG. 9 is a flow chart of a repairing method for the display panel according to yet another embodiment.

Accordingly, the disclosure provides another repairing method for the display panel. Refer to FIG. 8A and FIG. 9, the LEDs D are respectively bonded in the primary connecting region of all sub pixel regions on the circuit substrate, and then the step S301 is performed to supply a test signal to at least one of the connecting circuits to drive the corresponding micro LED for operation. Next, step S303 is performed to check whether one of the micro LEDs is at a normal status, an open-circuit status or a short-circuit status. When the micro LED is at the open-circuit status, step S305 is performed to bond a standby micro LED to the corresponding standby pad and the corresponding second pad (i.e. the alternative connecting region ZS6). When the micro LED is at the short-circuit status, step S307 is performed to cut the connecting wire in the connecting circuit so that the first pad is electrically insulated from the first wire. Also, a standby micro LED is bonded in the alternative connecting region ZS6 so that the two electrodes of the standby micro LED are electrically connected to the standby pad and the second pad.

To sum up the above description, the disclosure provides a display panel and a repairing method thereof. For the display panel, the connecting circuit in the display panel includes multiple pads. Some of the pads are configured to electrically connect to primary micro LEDs; and when an abnormal situation occurs, a standby micro LED is disposed to corresponding pads among all the pads according to an actual situation. Moreover, the connecting circuit includes a connecting wire. When a short-circuit defect exists, the connecting wire can be disconnected, so as to eliminate the short-circuit defect. On the other hand, by the arrangement of the pad locations, the structure can be applied to display panels of various specifications. Therefore, the display panel and the repairing method thereof provided in the disclosure may eliminate the foregoing open-circuit defect and short-circuit defect and repair the display panel which is originally regarded as a malfunctioned display panel. It equivalently increases the yield rate of the production line.

What is claimed is:

1. A display panel, comprising:
   micro LEDs, each of which comprises a first electrode and a second electrode; and
   a circuit substrate, on which the micro LEDs separate from each other and are disposed, and the circuit substrate comprising:
      first wires;
      second wires; and
      first connecting circuits electrically connecting the micro LEDs, and each of the first connecting circuits comprising:
         a first pad electrically connected to one of the first wires;
         a second pad having a first gap with the first pad, and the first and second electrodes of the corresponding micro LED respectively and electrically connected to the first pad and the second pad;
         a third pad electrically connected to one of the second wires, the third pad and the second pad having a second gap therebetween, and the second pad being located between the first pad and the third pad; and
         a connecting wire having two terminals respectively connected to the second pad and the third pad.

2. The display panel according to claim 1, wherein the connecting wire has a cutting portion to be cut, and a width of the cutting portion is shorter than a width of the second pad or of the third pad.

3. The display panel according to claim 1, wherein the circuit substrate further comprises sub pixel regions, each of the sub pixel regions comprises a primary connecting region, and the micro LEDs are respectively disposed in the primary connecting regions.

4. The display panel according to claim 3, further comprising:
   a standby micro LED, wherein the standby micro LED is electrically connected to one of the first connecting circuits which is located in respective one of the sub pixel regions, a part of the first pad corresponding to the one of the first connecting circuits and a part of the second pad together constitute the primary connecting region, another part of the first pad and another part of the second pad together constitute a first alternative connecting region, and the standby micro LED is disposed in the first alternative connecting region.

5. The display panel according to claim 3, further comprising:
   a standby micro LED; and
   a second connecting circuit located in one of the sub pixel regions and electrically connected to the standby micro LED, and the second connecting circuit comprising:
      another first pad electrically connected to one of the first wires;
      another second pad, wherein the first and second pads of the second connecting circuit have a third gap therebetween, a part of the first pad of the second connecting circuit and a part of the second pad of the second connecting circuit together constitute the primary connecting region, one of the micro LEDs is disposed in the primary connecting region to be electrically connected to the first and second pads of the second connecting circuit; and
      another third pad electrically connected to one of the second wires and separated from the second pad, the second and third pads of the second connecting circuit having a fourth gap therebetween, the second pad of the second connecting circuit being located between the first and third pads of the second connecting circuit;
   wherein the sub pixel region corresponding to the second connecting circuit further comprises a second alternative connecting region, the other part of the second pad of the second connecting circuit and a part of the third pad of the second connecting circuit together constitute the second alternative connecting region, and the standby micro LED is located in the second alternative connecting region.

6. The display panel according to claim 1, wherein the circuit substrate further comprises sub pixel regions, the micro LEDs are respectively disposed in the sub pixel regions, respective one of the first connecting circuits is located in respective one of the sub pixel regions, and each of the first connecting circuits further comprises:
   a fourth pad electrically connected to the first wire connected to the first pad, and the first pad and the fourth pad respectively being located at opposite sides of the first wire connected to the first pad; and
   a fifth pad electrically connected to the second wire connected to the third pad, the fourth pad and the fifth pad having a fifth gap therebetween, and the fourth pad being located between the fifth pad and the first pad.

7. The display panel according to claim 6, further comprising:
   a standby micro LED,
   wherein each of the sub pixel regions further comprises a primary connecting region and a alternative connecting region;
   a part of the first pad in respective one of the first connecting circuits and a part of the second pad together constitute the primary connecting region;
   the fourth pad and a part of the fifth pad together constitute the alternative connecting region;
   one of the micro LEDs is disposed in the primary connecting region; and
   the standby micro LED is disposed in the alternative connecting region.

8. The display panel according to claim 6, further comprising:
   a standby micro LED; and
   a second connecting circuit located in one of the sub pixel regions and comprising:

another first pad electrically connected to one of the first wires;

another second pad, wherein the first and second pads of the second connecting circuit have a third gap therebetween, and the first and second electrodes of the corresponding micro LED are respectively and electrically connected to the first and second pads of the second connecting circuit;

another third pad electrically connected to one of the second wires, wherein the second and third pads of the second connecting circuit have a fourth gap therebetween, and the second pad of the second connecting circuit is located between the first and third pads of the second connecting circuit;

another fourth pad electrically connected to the first wire connected to the first pad, and the first and fourth pads of the second connecting circuit respectively being located at opposite sides of the first wire connected to the first pad of the second connecting circuit; and another fifth pad electrically connected to the second wire connected to the third pad of the second connecting circuit, the second and fourth pads of the second connecting circuit having a fifth gap therebetween, and the fourth pad of the second connecting circuit being located between the first and fifth pads of the second connecting circuit;

wherein the standby micro LED is electrically connected to the second and third pads of the second connecting circuit.

9. A repairing method for a display panel comprising a circuit substrate and micro LEDs, the circuit substrate comprising connecting circuits, respective one of the connecting circuits electrically connected to respective one of the micro LEDs, each of the connecting circuits comprising a first pad, a second pad, a third pad and a connecting wire, the first to third pads separating from each other, the connecting wire connecting the second pad to the third pad, the first pad electrically connected to respective one of first wires, the third pad electrically connected to respective one of second wires, two electrodes of the corresponding micro LED respectively connecting to the first and second pads, and the repairing method comprising:

supplying a test signal to at least one of the connecting circuits to drive the corresponding micro LED;

checking whether one of the micro LEDs is at a normal status, an open-circuit status or a short-circuit status;

when it is determined that the micro LED connected to one of the connecting circuits is at the open-circuit status, connecting a standby micro LED to the first pad and the second pad so that the standby micro LED is electrically connected to the connecting circuit; and when it is determined that the micro LED connected to one of the connecting circuits is at the short-circuit status, electrically connecting another standby micro LED to the second and third pads of the connecting circuit and cutting the connecting wire of the connecting circuit so that the second pad is disconnected from the third pad.

* * * * *